United States Patent
Chiang et al.

(10) Patent No.: US 11,302,539 B2
(45) Date of Patent: Apr. 12, 2022

(54) SEMICONDUCTOR PACKAGING STRUCTURE AND METHOD FOR PACKAGING SEMICONDUCTOR DEVICE

(71) Applicant: Powertech Technology Inc., Hsinchu (TW)

(72) Inventors: Tsung-Han Chiang, Hsinchu (TW); Chun-Te Lin, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 16/987,470

(22) Filed: Aug. 7, 2020

(65) Prior Publication Data

US 2021/0351044 A1 Nov. 11, 2021

(30) Foreign Application Priority Data

May 8, 2020 (TW) .................................. 109115434

(51) Int. Cl.
*H01L 21/56* (2006.01)
*H01L 23/31* (2006.01)
*H01L 23/29* (2006.01)
*H01L 21/683* (2006.01)

(52) U.S. Cl.
CPC ........ *H01L 21/568* (2013.01); *H01L 21/6835* (2013.01); *H01L 23/293* (2013.01); *H01L 23/3107* (2013.01)

(58) Field of Classification Search
CPC . H01L 21/568; H01L 21/6835; H01L 23/293; H01L 23/3107

USPC .......................................................... 257/787
See application file for complete search history.

(56) References Cited

U.S. PATENT DOCUMENTS

| | | | |
|---|---|---|---|
| 8,710,683 B2* | 4/2014 | Kim ...................... | H01L 21/565 257/793 |
| 9,768,038 B2* | 9/2017 | Lin ......................... | H01L 24/19 |
| 9,947,554 B2* | 4/2018 | Choi ...................... | H01L 24/96 |
| 2008/0217717 A1* | 9/2008 | Pfister ............... | H01L 27/14634 257/443 |
| 2010/0224983 A1* | 9/2010 | Huang ................ | H01L 23/3128 257/692 |
| 2017/0354031 A1* | 12/2017 | Aoki ..................... | H01L 23/345 |

FOREIGN PATENT DOCUMENTS

| | | |
|---|---|---|
| TW | 201631688 A | 9/2016 |
| TW | 201926601 A | 7/2019 |
| TW | 201947731 A | 12/2019 |

OTHER PUBLICATIONS

Search Report appended to an Office Action, which was issued to Taiwanese counterpart application No. 109115434 by the TIPO dated Nov. 5, 2020, with an English translation thereof.

* cited by examiner

*Primary Examiner* — Nu A Vu
(74) *Attorney, Agent, or Firm* — Burris Law, PLLC

(57) ABSTRACT

A method for packaging a semiconductor device includes the steps of: disposing a wafer on a first carrier plate; attaching a second carrier plate to a side of the first carrier plate opposite to the wafer; disposing a chip unit on a side of the wafer opposite to the first carrier plate; and covering the wafer and the chip unit with an encapsulation layer. A semiconductor packaging structure is also disclosed.

15 Claims, 4 Drawing Sheets

SEMICONDUCTOR PACKAGING STRUCTURE AND METHOD FOR PACKAGING SEMICONDUCTOR DEVICE

CROSS-REFERENCE TO RELATED APPLICATION

This application claims priority of Taiwanese Invention Patent Application No. 109115434, filed on May 8, 2020.

FIELD

The disclosure relates to a semiconductor packaging structure and a method for packaging a semiconductor device, and more particularly to a semiconductor packaging structure and a packaging method capable of reducing warpage during the packaging process.

BACKGROUND

In a conventional method for packaging a semiconductor, a wafer having a circuit structure is disposed on a glass substrate in a middle-end-of-line (MEOL) process. Since the aforesaid wafer has a relatively low coefficient of thermal expansion (CTE), the glass substrate having a low CTE similar to that of the wafer is selected to reduce warpage of the wafer generated by a thermal treatment during the MEOL process.

The wafer disposed on the glass substrate having a low CTE is subjected to a back-end-of-line (BEOL) process subsequent to the MEOL process. In the BEOL process, semiconductor chips are stacked on the wafer followed by covering the same with a polymer packaging material, which is heated at high temperature for curing so as to form an encapsulating layer. However, the polymer packaging material undergoes shrinkage when cured at high temperature and then cooled to room temperature. In addition, the wafer and the glass substrate might also be shrunk during the curing and cooling processes, and a residual stress might be generated therebetween due to different degrees of shrinkage among the wafer, the stacked chips, and the polymer packaging material, thereby causing an excessive warpage. Therefore, the glass substrate with a low CTE, before being subjected to the BEOL process, is required to be replaced with one having a high CTE for reducing warpage between the wafer and the glass substrate.

When the glass substrate having a low CTE is replaced with a glass substrate having a high CTE, a temporary support substrate is first disposed on a side of the wafer opposite to the glass substrate having a low CTE. After removing the glass substrate having a low CTE, the glass substrate having a high CTE is disposed on the wafer opposite to the temporary support substrate followed by removal of the temporary support substrate.

However, the replacement process is not only complicated but also increases the risk of breakage of the wafer. Additionally, if the glass substrate having a high CTE is not tightly attached to the wafer, the subsequent BEOL process might not be successfully carried out, thereby increasing manufacturing time and cost.

SUMMARY

Therefore, an object of the disclosure is to provide a method for packaging a semiconductor device that can alleviate or eliminate at least one of the drawbacks of the prior art.

According to the disclosure, the method for packaging a semiconductor device includes the steps of:
(a) disposing a wafer on a first carrier plate;
(b) attaching a second carrier plate to a side of the first carrier plate opposite to the wafer;
(c) disposing a chip unit on a side of the wafer opposite to the first carrier plate; and
(d) covering the wafer and the chip unit with an encapsulation layer.

Another object of the disclosure is to provide a semiconductor packaging structure that can alleviate or eliminate at least one of the drawbacks of the prior art.

According to the disclosure, the semiconductor packaging structure includes a first carrier plate, a wafer, and a second carrier plate. The wafer is disposed on the first carrier plate. The second carrier plate is attached to a side of the first carrier plate opposite to the wafer, and has a thermal expansion coefficient that is not smaller than that of the first carrier plate.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
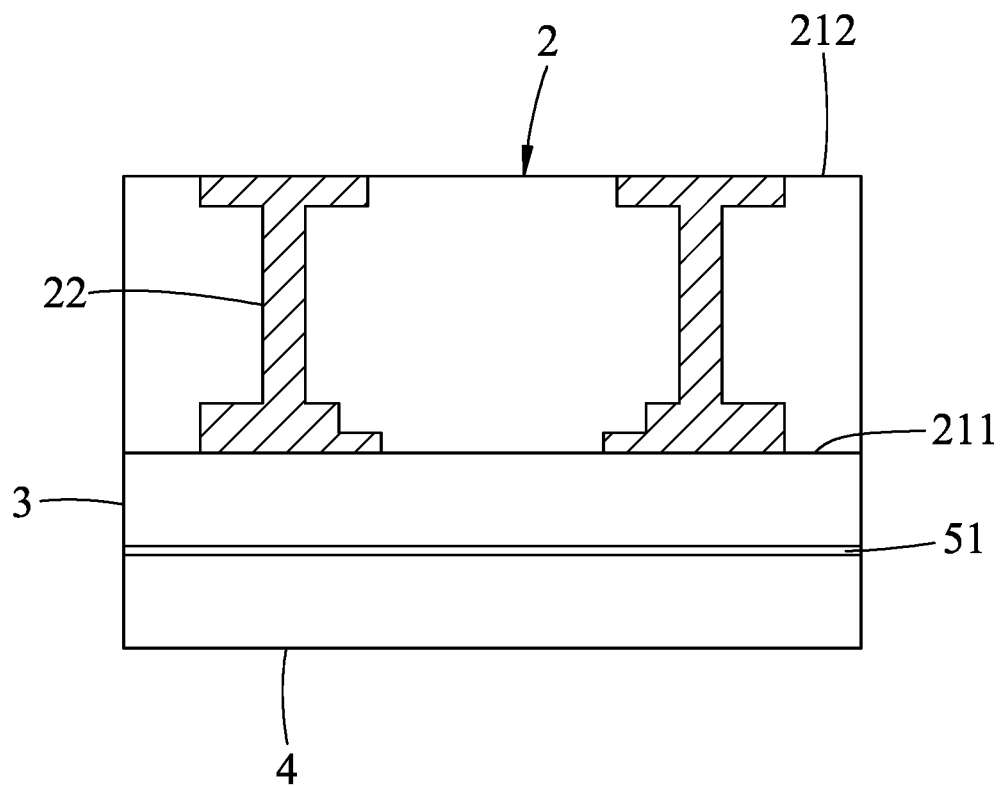
FIG. 1 is a schematic side view illustrating an embodiment of a semiconductor packaging structure according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a semiconductor packaging structure according to the present disclosure, which is adapted for use in a middle-end-of-line (MEOL) process and a back-end-of-line (BEOL) process, includes a wafer 2, a first carrier plate 3, a second carrier plate 4, and a bonding layer 51.

The wafer 2 includes a wafer body 21 that has a plate connection surface 211, a chip connection surface 212 opposite to the plate connection surface 211, and a circuit structure 22 that extends through the wafer body 21 and is exposed from the plate connection surface 211 and the chip connection surface 212.

The first carrier plate 3 is disposed on the plate connection surface 211 of the wafer body 21.

The second carrier plate 4 is attached to a side of the first carrier plate 3 opposite to the wafer 2.

In certain embodiments, each of the first carrier plate 3 and the second carrier plate 4 is made of a glass material. The second carrier plate 4 has a thermal expansion coefficient (CTE) that is not smaller than that of the first carrier plate 3. In an example of the wafer 2 being a silicon wafer (CTE: 3 ppm/° C.), the first carrier plate 3 is made of a material having a CTE ranging from 3.17 ppm/° C. to 3.3 ppm/° C., and the second carrier plate 4 is made of a material having a CTE ranging from 3.17 ppm/° C. to 9.6 ppm/° C. For example, the second carrier plate 4 is made of a glass material having a CTE ranging from 3.3 ppm/° C. to 9.6 ppm/° C., so as to more effectively reduce warpage of the wafer 2 formed during the packaging process to about 0.5 mm.

The bonding layer 51 is interposed between the first carrier plate 3 and the second carrier plate 4 for bonding the first carrier plate 3 and the second carrier plate 4. In this embodiment, the bonding layer 51 includes an adhesive agent.

Figure 2:
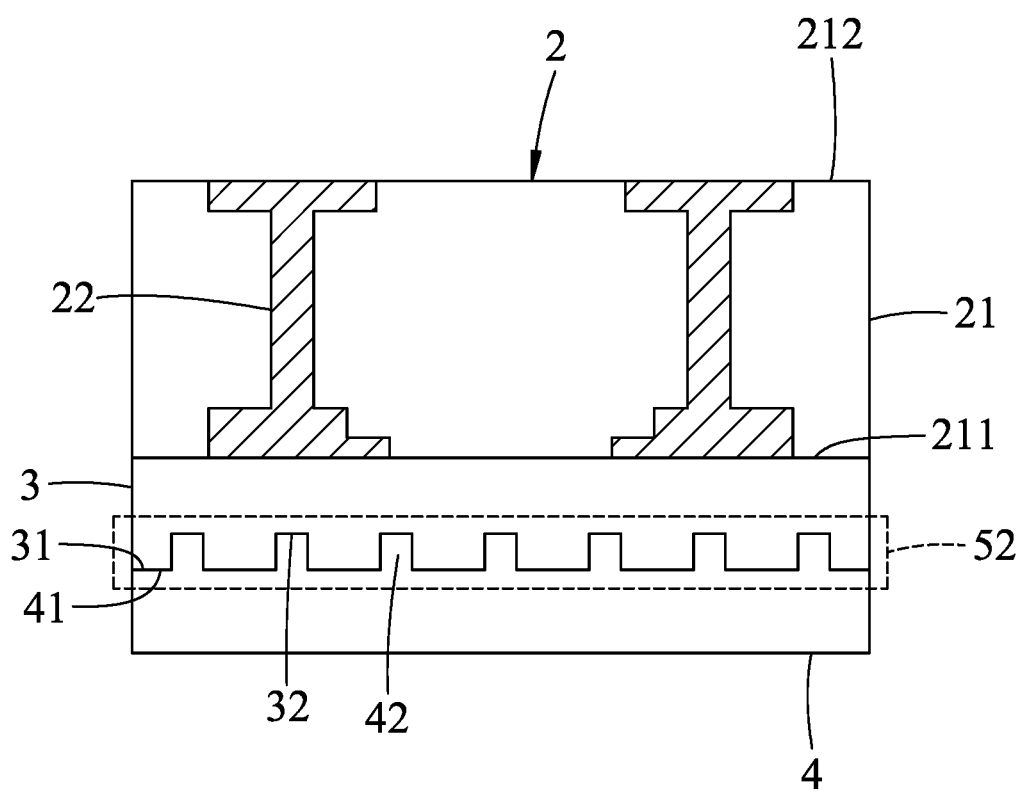
FIG. 2 is a schematic side view illustrating a variation of the embodiment.

Alternatively, referring to FIG. 2, in a variation of this embodiment, the second carrier plate 4 is attached to the first carrier plate 3 in an engaging manner.

To be specific, the first carrier plate 3 has a first attaching surface 31, and at least one first engaging part 32 that is formed on the first attaching surface 31. The second carrier plate 4 has a second attaching surface 41, and at least one second engaging part 42 that is formed on the second attaching surface 41 and that corresponds in shape to and is fittingly engaged with the first engaging part 32. One of the first and second engaging parts 32, 42 is a recessed portion which is indented inwardly from the corresponding one of the first and second attaching surface 31, 41, and the other one of the first and second engaging parts 32, 42 is a protruding portion which extends outwardly from the corresponding one of the first and second attaching surface 31, 41. In the variation of this embodiment, the first carrier plate 3 has a plurality of the first engaging parts 32 (e.g., holes), and the second carrier plate 4 has a plurality of the second engaging parts 42 (e.g., protruding columns) which correspond in shape and number to the first engaging parts 32 and are fittingly engaged with the first engaging parts 32, so as to securely fix the second carrier plate 4 to the first carrier plate 3.

It should be noted that, to provide an enhanced support to the first carrier plate 3, an additional carrier plate may be attached to the second carrier plate 4 opposite to the first carrier plate 3 in an engaging manner as mentioned or through a bonding layer (not shown in the figures). For example, the second carrier plate 4 may have at least one third engaging part that is formed on a surface opposite to the second engaging part 42 and that corresponds in shape to and is fittingly engaged with an engaging part formed on the additional carrier plate.

During the semiconductor packaging, particularly in the BEOL process following the MEOL process, the wafer 2 and chips to be disposed thereon are required to be covered with an encapsulation layer, which is formed by curing a polymer packaging material under heating followed by cooling. The chips and the cured polymer packaging material will undergo a large shrinkage due to temperature difference, such that the wafer 2 and the first carrier plate 3 may be prone to warping, breaking or creaking due to a large stress generated therebetween.

By virtue of the second carrier plate 4 having a CTE not smaller than that of the first carrier plate 3 to provide a resistant force against the deformation of the first carrier plate 3, there is no requirement to replace the first carrier plate 3 with another carrier plate having a higher CTE in the packaging process. Therefore, the semiconductor packaging structure according to the present disclosure is expected to be useful in the packaging process to reduce warpage that may occur in the wafer 2.

Figure 3:
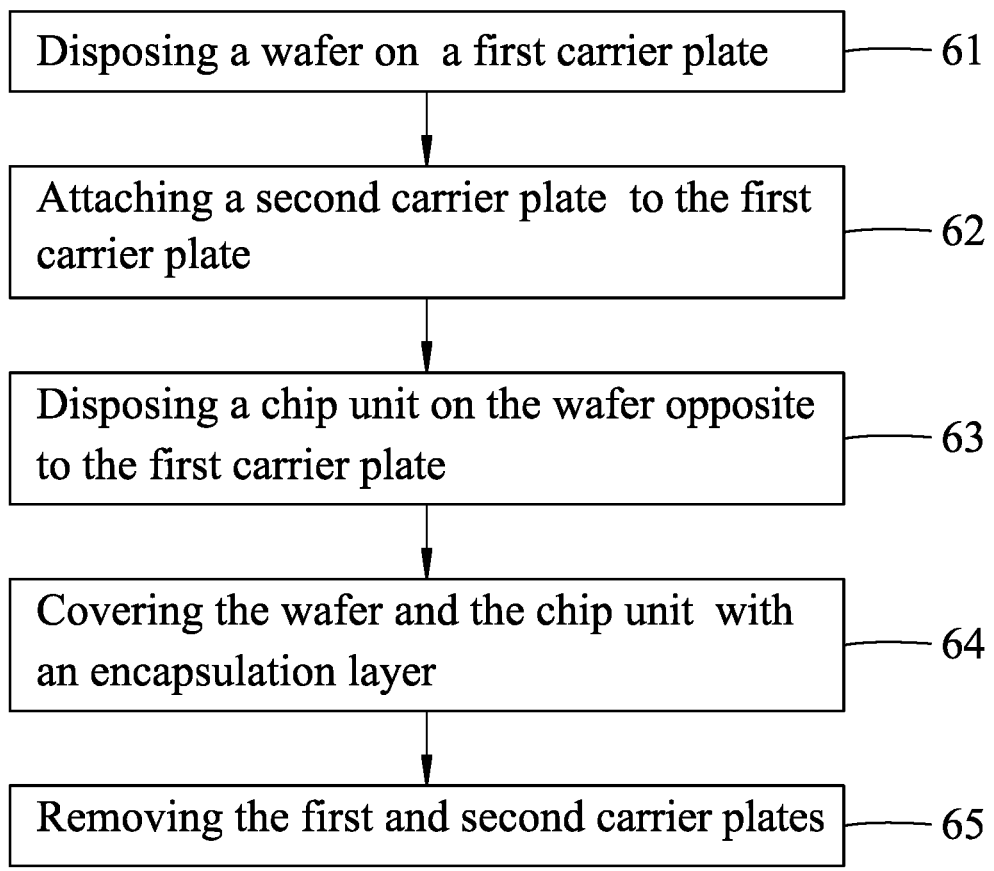
FIG. 3 is a flow chart illustrating a method for packaging a semiconductor device according to the disclosure.
Figure 4:
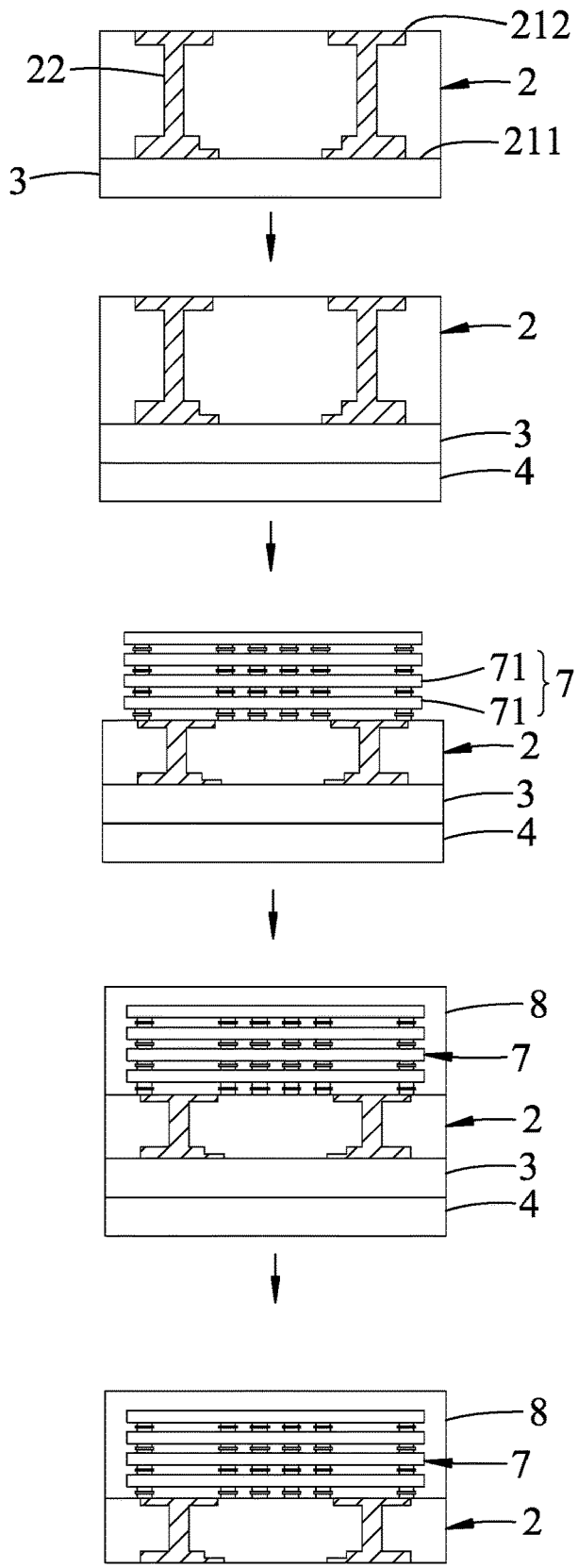
FIG. 4 shows schematic side views illustrating the consecutive steps of the method of this disclosure.

Referring to FIGS. 3 and 4, this disclosure also provides a method for packaging a semiconductor device, which includes the following consecutive steps S61 to S65.

In step 61, the wafer 2 is disposed on the first carrier plate 3. The wafer 2 has the plate connection surface 211, and the chip connection surface 212 opposite to the plate connection surface 211. The first carrier plate 3 is disposed on the plate connection surface 211 and is made of a glass material having a CTE ranging from 3.17 ppm/° C. to 3.3 ppm/° C., which is close to that of the wafer 2, so as to reduce thermal-induced warpage of the wafer 2 in the subsequent steps.

In step 62, the second carrier plate 4 is attached to the first carrier plate 3 opposite to the wafer 2. There are no particular limitations on the materials for making the first carrier plate 3 and the second carrier plate 4, as long as the second carrier plate 4 has a CTE that is not smaller than that of the first carrier plate 3. That is, the difference in a CTE between the wafer 2 and the first carrier plate 3 is not greater than that between the wafer 2 and the second carrier plate 4. In this embodiment, the second carrier plate 4 is made of a glass material having a CTE ranging from 3.17 ppm/° C. to 9.6 ppm/° C. The details of the attachment of the first and second carrier plates 3 and 4 can be referred from FIGS. 1 and 2, and are omitted herein for the sake of brevity.

In step 63, a chip unit 7 is disposed on a side of the wafer 2 opposite to the first carrier plate 3.

Specifically, the chip unit 7 is disposed on the chip connection surface 212 of the wafer 2, and is in electrical connection with the circuit structure 22. The chip unit 7 may include a plurality of chips 71 stacked on one another in a direction away from the chip connection surface 212.

In step 64, the wafer 2 and the chip unit 7 are covered with an encapsulation layer 8. Specifically, the chip unit 7 and the wafer 2 are firstly covered with a preheated polymer packaging material, and then curing the polymer packaging material followed by subjecting the cured polymer packaging material to cooling so as to form the encapsulation layer 8. The encapsulation layer 8 may be made of a thermosetting plastic material.

It should be noted that, in step 64, the polymer packaging material, upon curing under heating (i.e., absorbing a large amount of heat) and cooling (e.g., to room temperature), may be shrink, which in turn might lead to a warpage on the chip unit 7, the wafer 2 and/or the first carrier plate 3 due to a large difference of the degree of shrinkage thereamong. Additionally, as the number of the chips 71 stacking on the wafer 2 increases, the degree of warpage increases due to the increased contact area between the chips 71 and the encapsulation layer 8 so as to cause severe shrinkage. Therefore, by virtue of the second carrier plate 4 attaching to the first carrier plate 3 and having a CTE not smaller than that of the first carrier plate 4 for providing support, the degree of shrinkage of the first carrier plate 3 and the wafer 2 upon cooling to room temperature can be alleviated, so as to reduce warpage.

It should be noted that the encapsulation layer 8 may also cover an area outside the chip unit 7 to form a fan-out region, such that the resulting packaged structure obtained by the method of this disclosure can be a fan-out wafer-level package (FOWLP).

In step 65, the first carrier plate 3 and the second carrier plate 4 are removed from the wafer 2, so as to obtain the packaged semiconductor device.

In summary, by attaching to the side of the first carrier plate 3 opposite to the wafer 2, the second carrier plate 4 which has the CTE not smaller than that of the first carrier plate 3, the semiconductor packaging structure of this disclosure is capable of alleviating the degree of shrinkage (deformation) of the wafer 2 and the first carrier plate 3 due to temperature variation in the packaging process, so as to minimize or avoid forming a large warpage thereon. Moreover, compared to the conventional packaging method which requires the carrier plate to be replaced by another one, the method of the present disclosure not only significantly lowers the manufacturing cost and time, but also reduces the risk of breakage of the wafer 2 during the replacement of the carrier plate.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for packaging a semiconductor device, comprising the steps of:
    disposing a wafer on a first carrier plate, the wafer including a wafer body that has a plate connection surface and a chip connection surface opposite to the plate connection surface, and a circuit structure that extends through the wafer body and is exposed from the plate connection surface and the chip connection surface, the first carrier plate being disposed on the plate connection surface;
    attaching a second carrier plate to a side of the first carrier plate opposite to the wafer;
    disposing a chip unit on a side of the wafer opposite to the first carrier plate, the chip unit being disposed on the chip connection surface, being in electrical connection with the circuit structure, and including a plurality of stacked chips stacked on one another in a direction away from the chip connection surface; and
    covering the wafer and the chip unit with an encapsulation layer.

2. The method of claim 1, wherein the second carrier plate has a thermal expansion coefficient that is not smaller than that of the first carrier plate.

3. The method of claim 1, wherein the second carrier plate is attached and bonded to the first carrier plate through a bonding layer.

4. The method of claim 1, wherein the first carrier plate has a first attaching surface and at least one first engaging part that is formed on the first attaching surface, and the second carrier plate has a second attaching surface and at least one second engaging part that is formed on the second attaching surface and that corresponds in shape to and is fittingly engaged with the first engaging part.

5. The method of claim 4, wherein one of the first and second engaging parts is a recessed portion, and the other one of the first and second engaging parts is a protruding portion.

6. The method of claim 1, further comprising a step of removing the first carrier plate and the second carrier plate from the wafer after the step of covering the wafer and the chip unit with the encapsulation layer.

7. The method of claim 1, wherein the encapsulation layer is made of a thermosetting plastic material.

8. A semiconductor device, comprising:
    a first carrier plate having a first attaching surface and at least one first engaging part that is formed on said first attaching surface;
    a wafer disposed on said first carrier plate;
    a second carrier plate attached to a side of said first carrier plate opposite to said wafer, and having a thermal expansion coefficient that is not smaller than that of said first carrier plate, said second carrier plate having a second attaching surface and at least one second engaging part that is formed on said second attaching surface and that corresponds in shape to and is fittingly engaged with said first engaging part, one of said first and second engaging parts being a recessed portion, and the other one of said first and second engaging parts being a protruding portion; and
    a chip unit disposed on a side of the wafer opposite to the first carrier plate, the chip unit including a plurality of stacked chips stacked on one another in a direction away from the wafer.

9. The semiconductor device of claim 8, further comprising a bonding layer interposed between said first carrier plate and said second carrier plate to bond said first carrier plate and said second carrier plate.

10. The semiconductor device of claim 9, wherein said bonding layer includes an adhesive agent.

11. The semiconductor device of claim 8, wherein said first carrier plate has a plurality of first engaging parts, and said second carrier plate has a plurality of second engaging parts that correspond in shape and number to and are fittingly engaged with said first engaging parts.

12. The semiconductor device of claim 8, wherein said thermal expansion coefficient of said first carrier plate is within a range from 3.17 ppm/° C. to 3.3 ppm/° C.

13. The semiconductor device of claim 8, wherein said thermal expansion coefficient of said second carrier plate is within a range from 3.17 ppm/° C. to 9.6 ppm/° C.

14. The semiconductor device of claim 8, wherein the wafer is a silicon wafer.

15. A comprising:
    a first carrier plate;
    a wafer disposed on said first carrier plate;
    a second carrier plate attached to a side of said first carrier plate opposite to said wafer, and having a thermal expansion coefficient that is not smaller than that of said first carrier plate; and
    a chip unit disposed on a side of the wafer opposite to the first carrier plate, the chip unit including a plurality of stacked chips stacked on one another in a direction away from the wafer, wherein each of said first carrier plate and said second carrier plate is made of a glass material.

* * * * *

UNITED STATES PATENT AND TRADEMARK OFFICE
CERTIFICATE OF CORRECTION

PATENT NO. : 11,302,539 B2
APPLICATION NO. : 16/987470
DATED : April 12, 2022
INVENTOR(S) : Tsung-Han Chiang and Chun-Te Lin Page 1 of 1

It is certified that error appears in the above-identified patent and that said Letters Patent is hereby corrected as shown below:

In the Claims

Column 6, Line 57, please replace "15. A comprising:" with --15. A semiconductor device comprising:--.

Signed and Sealed this
Nineteenth Day of July, 2022

Katherine Kelly Vidal
*Director of the United States Patent and Trademark Office*